US010755970B2

(12) United States Patent
Chiang et al.

(10) Patent No.: US 10,755,970 B2
(45) Date of Patent: Aug. 25, 2020

(54) SEMICONDUCTOR DEVICE STRUCTURES

(71) Applicant: Taiwan Semiconductor Manufacturing Co., Ltd., Hsin-Chu (TW)

(72) Inventors: Hsin-Che Chiang, Hsinchu (TW); Ju-Li Huang, Nantou County (TW); Chun-Sheng Liang, Changhua County (TW); Jeng-Ya David Yeh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/009,519

(22) Filed: Jun. 15, 2018

(65) Prior Publication Data

US 2019/0385896 A1    Dec. 19, 2019

(51) Int. Cl.
| | | |
|---|---|---|
| *H01L 29/76* | (2006.01) | |
| *H01L 21/768* | (2006.01) | |
| *H01L 23/522* | (2006.01) | |
| *H01L 23/532* | (2006.01) | |
| *H01L 29/417* | (2006.01) | |
| *H01L 21/311* | (2006.01) | |

(52) U.S. Cl.
CPC ...... *H01L 21/7682* (2013.01); *H01L 21/7684* (2013.01); *H01L 21/76819* (2013.01); *H01L 21/76843* (2013.01); *H01L 21/76865* (2013.01); *H01L 23/5226* (2013.01); *H01L 23/5329* (2013.01); *H01L 29/41775* (2013.01); *H01L 21/31111* (2013.01); *H01L 21/31116* (2013.01); *H01L 23/53238* (2013.01); *H01L 23/53252* (2013.01); *H01L 23/53266* (2013.01)

(58) Field of Classification Search
None
See application file for complete search history.

(56) References Cited

U.S. PATENT DOCUMENTS

| | | | |
|---|---|---|---|
| 8,039,902 B2 * | 10/2011 | Kim | H01L 21/26506 257/377 |
| 8,796,666 B1 | 8/2014 | Huang et al. | |
| 8,822,243 B2 | 9/2014 | Yan et al. | |
| 8,987,142 B2 | 3/2015 | Lee et al. | |
| 9,093,530 B2 | 4/2015 | Huang et al. | |
| 9,053,279 B2 | 6/2015 | Chang et al. | |
| 9,099,530 B2 | 8/2015 | Lin et al. | |
| 9,153,478 B2 | 10/2015 | Liu et al. | |
| 9,501,601 B2 | 11/2016 | Chang et al. | |
| 9,548,303 B2 | 1/2017 | Lee et al. | |
| 9,679,813 B2 * | 6/2017 | Chen | H01L 21/76805 |

(Continued)

*Primary Examiner* — Hung K Vu
(74) *Attorney, Agent, or Firm* — Hayne and Boone LLP

(57) ABSTRACT

In one exemplary aspect, a method for semiconductor manufacturing comprises forming first and second silicon nitride features on sidewall surfaces of a contact hole, where the contact hole is disposed in a dielectric layer and above a source/drain (S/D) feature. The method further comprises forming a contact plug in the contact hole, the contact plug being electrically coupled to the S/D feature, removing a top portion of the contact plug to create a recess in the contact hole, forming a hard mask layer in the recess, and removing the first and second silicon nitride features via selective etching to form first and second air gaps, respectively.

20 Claims, 11 Drawing Sheets

(56) References Cited

U.S. PATENT DOCUMENTS

| | | | |
|---|---|---|---|
| 9,716,154 B2 * | 7/2017 | Chang | H01L 29/4991 |
| 9,876,114 B2 | 1/2018 | Huang | |
| 2012/0104512 A1 * | 5/2012 | Horak | H01L 29/4983 |
| | | | 257/401 |
| 2016/0049487 A1 * | 2/2016 | Xu | H01L 29/41791 |
| | | | 257/288 |

* cited by examiner

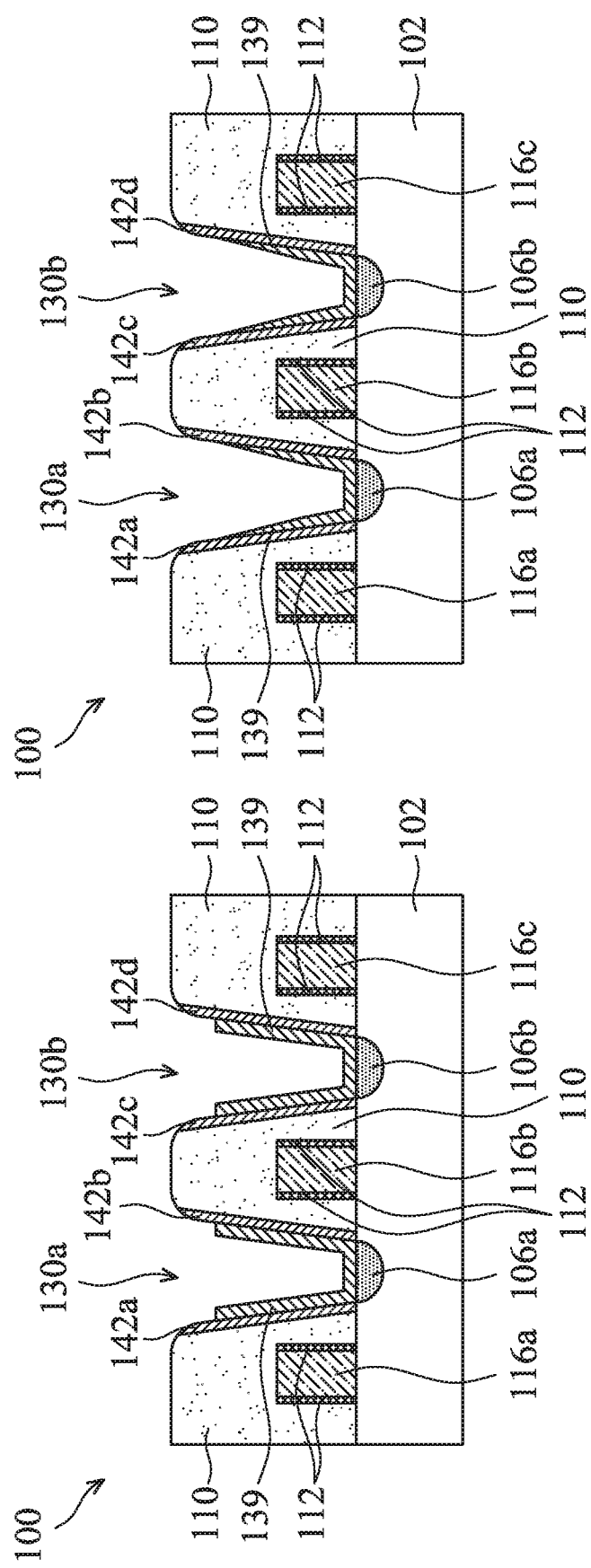

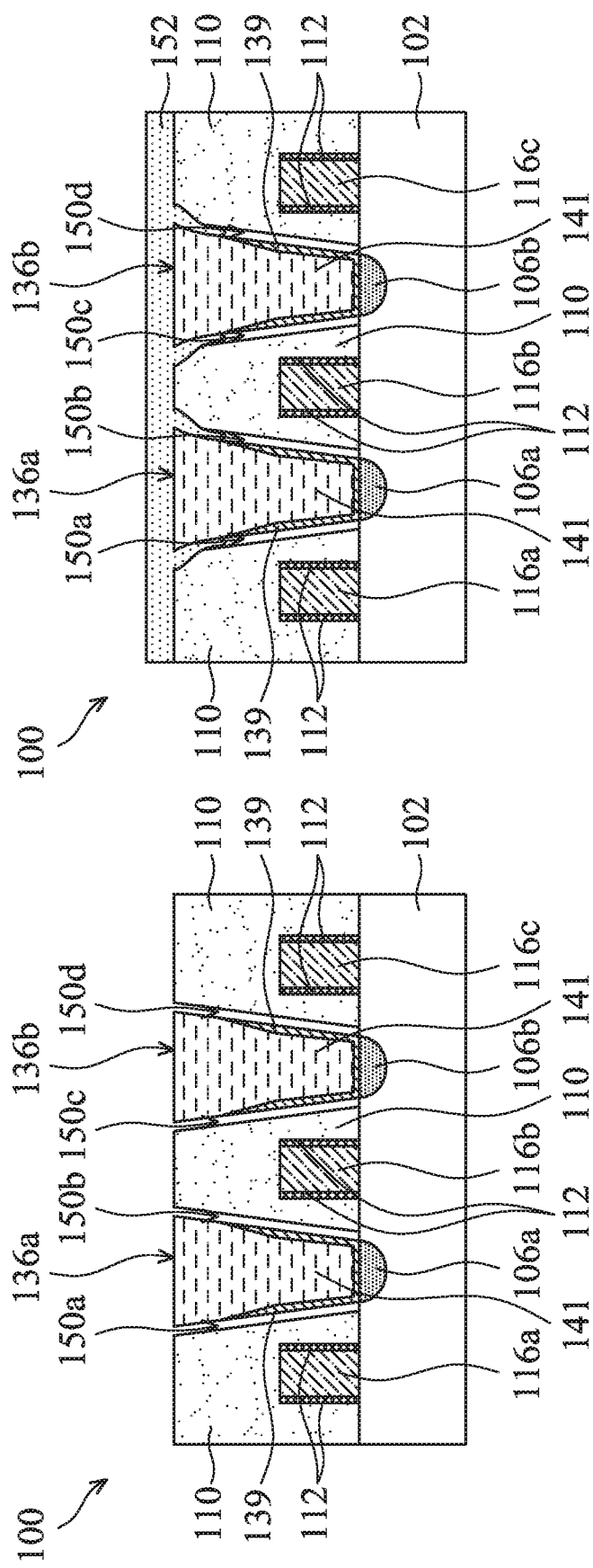

SEMICONDUCTOR DEVICE STRUCTURES

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing semiconductor devices.

For example, as device geometry shrinks, parasitic capacitance increases between interconnects such as source/drain (S/D) contact plugs and nearby gates. The increased parasitic capacitance degrades device performance. To lower parasitic capacitance, insulating materials with a relatively low dielectric constant (k), such as low-k dielectrics and air gaps, have been used between S/D features and nearby gates. But these materials have proven difficult to fabricate. In some instances, low-k dielectric materials are brittle, unstable, difficult to deposit, or sensitive to processes such as etching, annealing, and polishing, and air gap formations are difficult to control. For these reasons and others, it is desirable to improve the fabrication techniques of dielectrics between interconnects in order to reduce the parasitic capacitance while maintaining a high overall transistor density in IC.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 2D, 2E, and 2F are schematic diagrams illustrating cross-sectional views of a semiconductor device during various stages of the method shown in FIG. 1.

FIGS. 3A, 3B, and 3C are schematic diagrams illustrating cross-sectional views of a semiconductor device during more stages of the method shown in FIG. 1.

DETAILED DESCRIPTION

Figure 1:
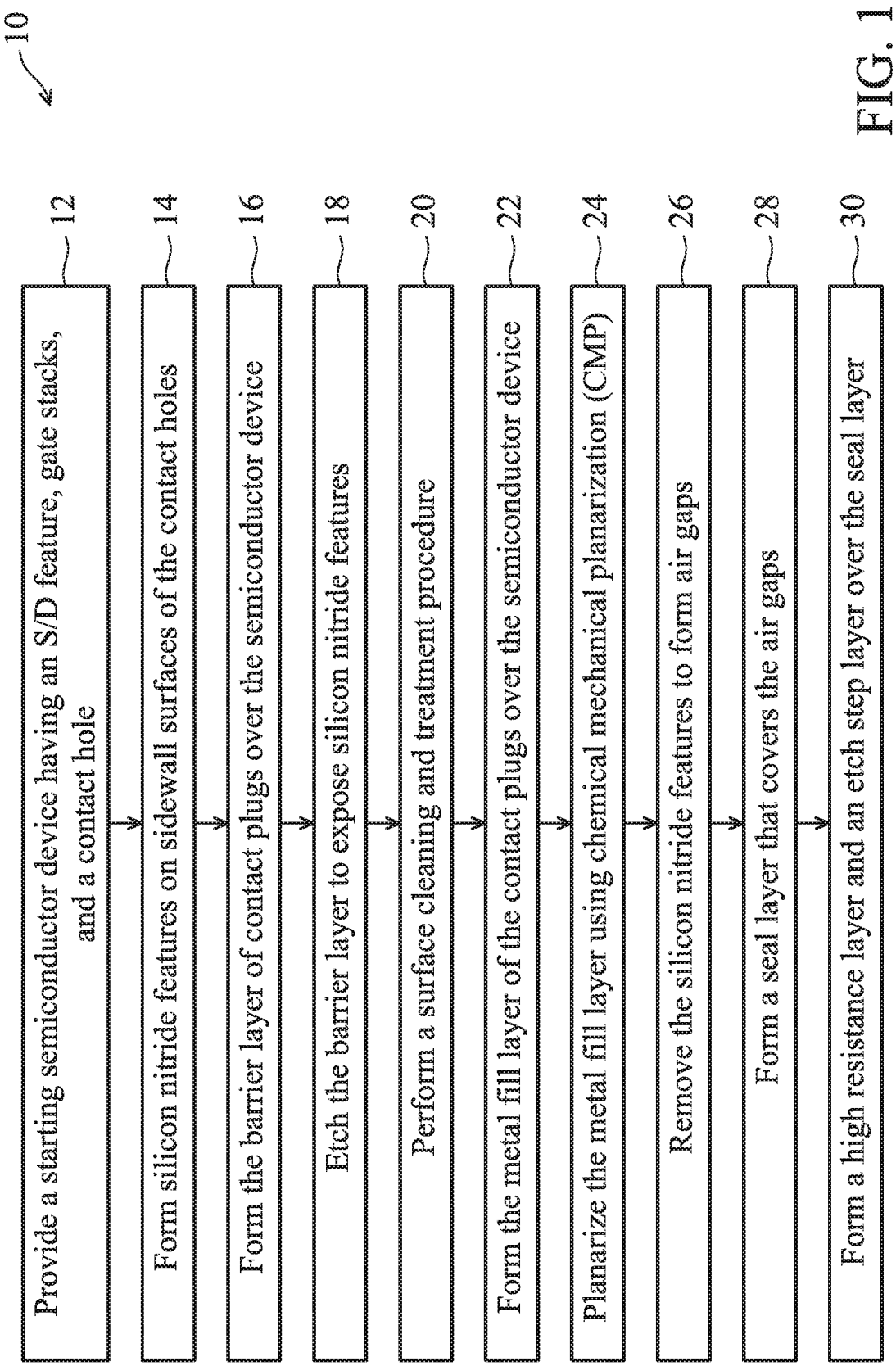
FIG. 1 is a flow chart showing a first method for fabricating a semiconductor device, according to various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is generally related to semiconductor devices and fabrication methods thereof, and more particularly to the formation of air gaps between metal lines such as contact plugs and neighboring gates. As FinFET technologies progress towards smaller technology nodes (such as 16 nm, 10 nm, 7 nm, 5 nm, and below), decreasing fin pitch is placing significant constraints on materials that can be used between gate stacks and neighboring contact plugs that are connected to S/D features. To minimize parasitic capacitance between gate stacks and contact plugs, an air gap can help because air has lower dielectric constant (k=1) than other dielectric materials. But, when air gaps are formed before contact plugs, they tend to be near the gate stacks and far away from contact plugs. Further, the air gaps are prone to be damaged by the subsequent formation of the contact plugs. For example, when forming a contact plug, overlay shift may occur if a mask for patterning the contact plug is not aligned perfectly with lower layer components. With overlay shift, the position of a contact hole may be very close to a neighboring gate stack. In this case, etching the contact hole would expose an already-sealed air gap, and the exposed air gap may be partially or completely filled by the contact plug. The air gap then loses its purpose of reducing parasitic capacitance.

The present disclosure avoids these issues by forming air gaps after (not before or simultaneous with) the formation of contact plugs. For example, air gaps are formed by first depositing silicon nitride features in a contact hole, then forming a contact plug sandwiched between the silicon nitride features, and then selectively etching away the silicon nitride features. Selective removal of the silicon nitride features is realized by etch selectivity of silicon nitride feature material(s) compared to other surrounding materials. The post-plug formation of air gaps disclosed herein leads to air gaps that extend above top surfaces of neighboring gate stacks. As a result, parasitic capacitance between gate stacks and contact plugs can be effectively reduced. Further, the disclosed air gaps directly touch a contact plug above an S/D feature, thereby exposing the sidewall of the contact plug to air. Such air exposure helps heat dissipation when the contact plug is conducting an electric current.

The post-plug formation of air gaps disclosed herein may be realized using various fabrication approaches. FIG. 1 illustrates a first method 10 for fabricating a semiconductor device (or device structure) 100 according to various aspects of the present disclosure. Method 10 is merely an example, and is not intended to limit the present disclosure beyond what is explicitly recited in the claims. Additional operations can be provided before, during, and after method 10, and some operations described can be replaced, eliminated, or moved around for additional embodiments of method 10. In the following discussion, method 10 is described with reference to FIGS. 2A-2F and 3A-3C, which are fragmentary diagrammatic cross-sectional views of a semiconductor device 100, in portion or entirety, at various fabrication stages according to various embodiments of the present disclosure.

Semiconductor device 100 may be or include a FinFET device (a fin-based transistor), which can be included in a microprocessor, memory cell, and/or other IC devices. Semiconductor device 100 may be an intermediate device fabricated during processing of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOSs) transistors, bipolar transistors, high voltage transistors, high frequency transistors, other suitable components, or combinations thereof. FIGS. 2A-2F have been simplified for the sake of clarity to better understand the inventive concepts of the present disclosure. Additional features can be added in semiconductor device 100, and some of the features described below can be replaced, modified, or eliminated in other embodiments of semiconductor device 100.

Figures 2A, 2B:
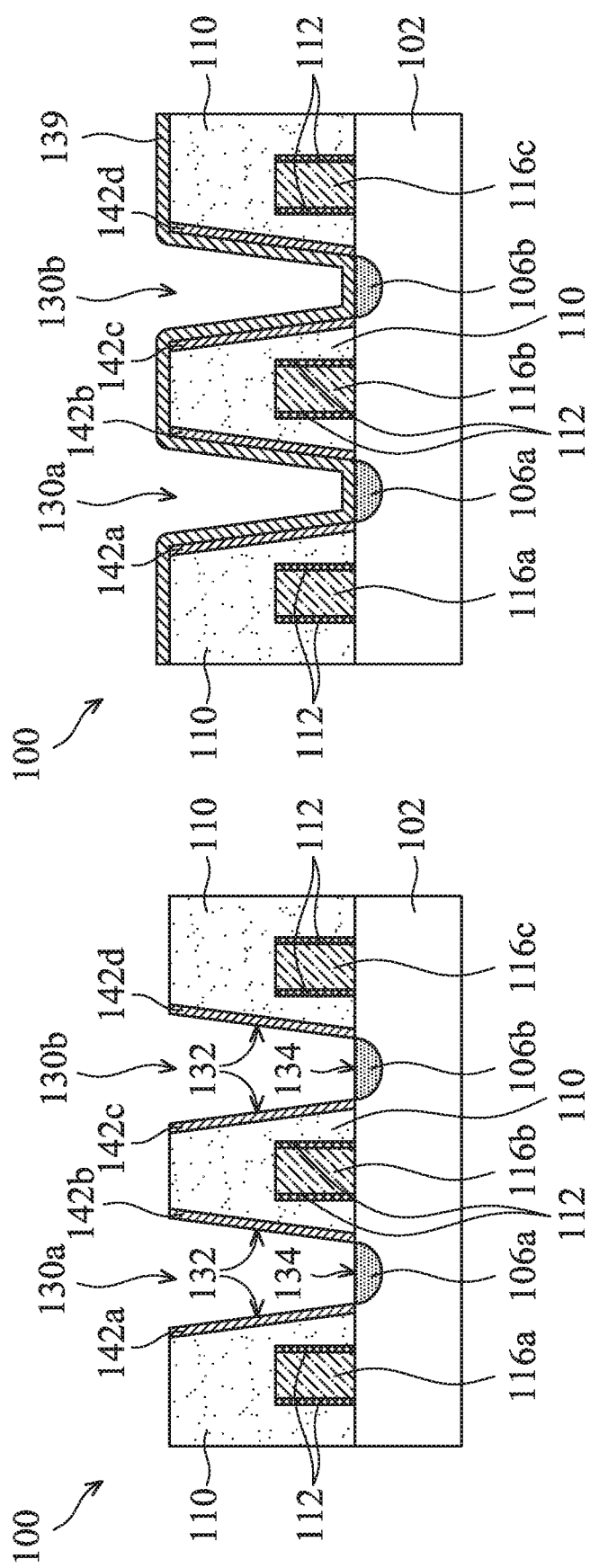

At operation 12, method 10 provides, or is provided with, a starting semiconductor device 100. As shown in FIG. 2A, the starting semiconductor device 100 includes components such as a substrate 102, source or drain (S/D) features 106a and 106b, an inter-layer dielectric (ILD) layer 110, gate spacers 112, gate stacks 116a, 116b, and 116c, as well as contact holes 130a and 130b. Semiconductor device 100 may include other components not shown in figures herein. Semiconductor device 100's components are further described below.

Substrate 102 is a semiconductor substrate (e.g., a silicon wafer) in the present embodiment. Alternatively, substrate 102 may comprise another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium (SiGe), gallium arsenide phosphide, aluminum indium phosphide, aluminum gallium arsenide, gallium indium arsenide, gallium indium phosphide, and gallium indium arsenide phosphide; or combinations thereof. Substrate 102 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 102 can include various doped regions (not shown) depending on design requirements of semiconductor device 100. In some implementations, substrate 102 includes p-type doped regions (for example, p-type wells) doped with p-type dopants, such as boron, indium, other p-type dopant, or combinations thereof. In some implementations, substrate 102 includes n-type doped regions (for example, n-type wells) doped with n-type dopants, such as phosphorus, arsenic, other n-type dopant, or combinations thereof. In some implementations, substrate 102 includes doped regions formed with a combination of p-type dopants and n-type dopants. The various doped regions can be formed directly on and/or in substrate 102, for example, providing a p-well structure, an n-well structure, a dual-well structure, a raised structure, or combinations thereof. An ion implantation process, a diffusion process, and/or other suitable doping process can be performed to form the various doped regions in substrate 102.

S/D features 106a and 106b are disposed on substrate 102 and may include n-type doped silicon for NFETs, p-type doped silicon germanium for PFETs, or other suitable materials. S/D features 106a and 106b may be formed by etching depressions in active regions adjacent gate stacks 116a-116c, and then epitaxially growing semiconductor materials in the depressions. The epitaxially grown semiconductor materials may be doped with proper dopants in-situ or ex-situ. S/D features 106a and 106b may have any suitable shape and may be wholly or partially embedded in the active region. For example, depending on the amount of epitaxial growth, S/D features 106a and 106b may rise above, at, or below the top surface of a fin.

ILD layer 110 is disposed on substrate 102. ILD layer 110 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. ILD layer 110 may be formed by plasma enhanced chemical vapor deposition (PECVD), flowable CVD (FCVD), or other suitable methods.

Gate stacks 116a-116c may each include a gate dielectric layer at the bottom and a gate electrode layer disposed on the gate dielectric layer. The gate dielectric layer may include $SiO_2$ or a high-k dielectric material such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The gate dielectric layer may be deposited using CVD, physical vapor deposition (PVD), atomic layer deposition (ALD), and/or other suitable methods. The gate electrode layer of gate stack 116a, 116b, or 116c may include polysilicon and/or one or more metal layers. For example, the gate electrode layer may include work function metal layer(s), conductive barrier layer(s), and metal fill layer(s). The work function metal layer may be a p-type or an n-type work function layer depending on device type. The p-type work function layer may comprise titanium aluminum nitride (TiAlN), titanium nitride (TiN), tantalum nitride (TaN), ruthenium (Ru), molybdenum (Mo), tungsten (W), platinum (Pt), another suitable metal, or combinations thereof. The n-type work function layer may comprise titanium (Ti), aluminum (Al), tantalum carbide (TaC), tantalum carbide nitride (TaCN), tantalum silicon nitride (TaSiN), titanium aluminum nitride (TiAlN), titanium silicon nitride (TiSiN), another suitable metal, or combinations thereof. The metal fill layer may include aluminum (Al), tungsten (W), cobalt (Co), and/or other suitable materials. The gate electrode layer may be deposited using methods such as CVD, PVD, plating, and/or other suitable processes. Gate stack 116a, 116b, or 116c may further include an interfacial layer under the gate dielectric layer. The interfacial layer may include a dielectric material such as $SiO_2$ or SiON, and may be formed by chemical oxidation, thermal oxidation, ALD, CVD, and/or other suitable methods.

Each gate stack may be coupled to neighboring gate spacer 112. In some embodiments, gate spacer 112 is considered as a sidewall of its neighboring gate stack. Each gate spacer 112 may be a single layer or multi-layer structure. For example, gate spacer 112 may include a dielectric material, such as silicon oxide, silicon nitride, silicon oxynitride, other dielectric material, or combination thereof. Gate spacer 112 may be formed by deposition (e.g., CVD or PVD) and etching processes.

Gate stacks 116a-116c may be formed by any suitable processes such as a gate-first process and a gate-last process. In an example gate-first process, various material layers are deposited and patterned to become gate stacks 116a-116c before S/D features 106a and 106b are formed. In an example gate-last process (also called a gate replacement process), temporary gate structures (sometimes called "dummy" gates) are formed first. Then, after transistor S/D features 106a and 106b are formed, the temporary gate structures are removed and replaced with gate stacks 116a-116c. In the embodiment shown in FIG. 2A, gate stack 116a, 116b, or 116c may be disposed over a channel region of a transistor to function as a gate terminal. Although not shown in FIG. 2A, a metal plug may be disposed over and electrically coupled to such a gate stack, for example, to apply an adjustable voltage to the gate stack. The voltage may control a channel region between S/D features such as 106a and 106b.

As shown in FIG. 2A, contact hole 130a is situated between gate stacks 116a and 116b, while contact hole 130b is situated between gate stacks 116b and 116c. Contact holes 130a and 130b expose top portions of S/D features 106a and 106b, respectively. Each contact hole comprises a sidewall surface 132 and a bottom surface 134, where bottom surface 134 is effectively the same as the top surface of the underlying S/D feature.

At operation 14, method 10 (FIG. 1) forms silicon nitride features on sidewall surfaces 132 of the contact holes. Still referring to FIG. 2A, silicon nitride features 142a and 142b are formed in contact hole 130a, while silicon nitride features 142c and 142d are formed in contact hole 130b. The formation of silicon nitride features involves multiple steps. In a first step, a silicon nitride layer is formed over semiconductor device 100, for example, to cover at least contact holes 130a and 130b, but may also cover the topmost surface of semiconductor device 100. The silicon nitride layer may be formed by one or more methods such as PECVD, ALD, and/or other suitable deposition or nitridation processes. For example, the silicon nitride layer may be a thin layer with a generally conformal thickness across the top surface of semiconductor device 100. In addition to silicon nitride, this layer may comprise other suitable materials such as doping carbon. In some embodiments, multiple cycles of deposition may be executed in order to reach a target thickness of the silicon nitride layer. In a second step, the silicon nitride layer is selectively etched (e.g., using dry etching assisted by a mask) to remove portions located on bottom surfaces 134 and the topmost surface of ILD layer 110. As a result, silicon nitride features 142a-142d remain on sidewall surfaces 132. Since the top surfaces of S/D features 106a and 106b are to be exposed, the selective etching process is performed so as to etch the silicon nitride layer portions located on bottom surface 134. Further, the selective etching process may also "thin" (remove a thickness portion of) silicon nitride features 142a-142d to open up more lateral space for the later deposition of contact plugs. In some embodiments, operation 14 is controlled to realize target dimensions (e.g., height and width) of silicon nitride features 142a-142d. The dimensions of silicon nitride features 142a-142d may effectively control the dimensions of air gaps, which are formed by removing silicon nitride features 142a-142d (described below).

It should be noted that, since semiconductor device 100 is a three-dimensional structure (cross-sectional views of which are shown herein), silicon nitride features 142a and 142b may actually represent the same dummy feature, but they are labeled separately for clarity in the cross-sectional views. The same consideration applies to other labels such as silicon nitride features 142c and 142d (as well as air gaps 150a-150b, and air gaps 150c and 150d, all described further below).

Figures 2E, 2F:
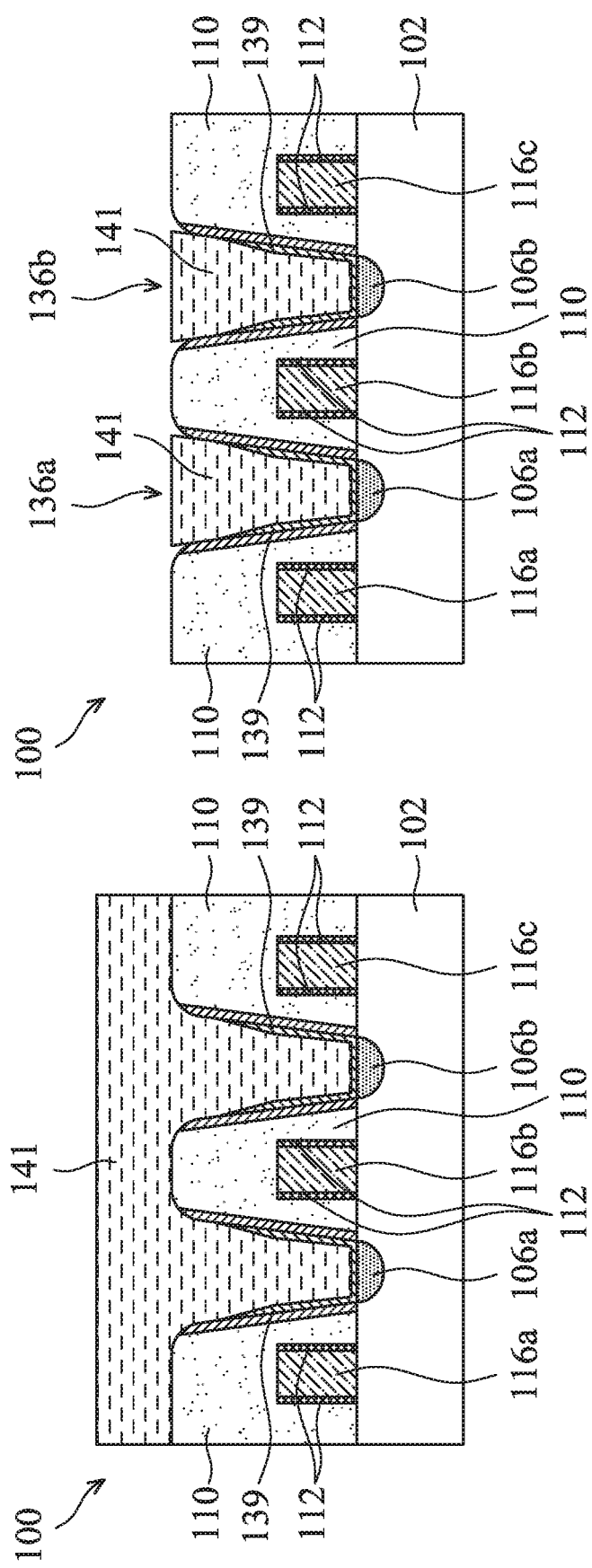

Method 10 then fills one or more conductive materials into contact holes 130a and 130b to form first and second contact plugs, respectively. The contact plugs are labeled as 136a and 136b in FIG. 2F, but their formation goes through several steps shown in FIGS. 2C-2F, since each contact plug includes a barrier layer 139 and a metal fill layer 141 over and adjacent barrier layer 139, as shown in FIG. 2F.

Specifically, at operation 16, method 10 forms barrier layer 139 over semiconductor device 100 (FIG. 2B). Barrier layer 139 covers at least contact holes 130a and 130b, but may also cover the topmost surface of semiconductor device 100, as shown in FIG. 2B. Barrier layer 139 includes a metal nitride layer such as TaN or TiN. Barrier layer 139 may be formed by PVD, CVD, ALD, plating, or other suitable methods. In an embodiment, an ALD process is used to uniformly deposit barrier layer 139 over semiconductor device 100. Barrier layer 139 may help prevent the to-be-formed metal fill layer 141 from penetrating into surrounding silicon or oxide regions. In some embodiments, barrier layer 139 also includes a metal silicide layer under the metal nitride layer. For instance, method 10 first deposits a metal layer (using same metal as the metal nitride layer, such as Ta or Ti), and then performs an annealing process at an elevated temperature. During annealing the metal layer reacts with semiconductor material(s) such as silicon in S/D features 106a and 106b to form the metal silicide layer thereon. The metal silicide layer may include tantalum silicide, titanium silicide, or other suitable silicidation or germanosilicidation. The metal silicide layer may cover a heavily doped region of S/D features 106a and 106b and in some cases may be considered part of S/D features 106a and 106b.

At operation 18, method 10 (FIG. 1) etches or "pulls back" barrier layer 139 to partially expose silicon nitride features 142a-142d (FIG. 2C). Specifically, method 10 selectively removes portions of barrier layer 139 that are disposed on the topmost surface of ILD layer 110 as well as the upper sidewall section of contact holes 130a and 130b. A dry or wet etching process may be used. Enough of barrier layer 139 is removed so that top portions of silicon nitride features 142a-142d are exposed to the ambient environment.

At operation 20, method 10 (FIG. 1) performs a surface cleaning and treatment procedure to clean and treat the surface of barrier layer 139 as well as the exposed surfaces of silicon nitride features 142a-142d, in order to remove chemicals and residuals thereon (FIG. 2D). Surface cleaning and treatment may be performed using any suitable methods and/or materials. In an embodiment, deep cleaning is performed using a solution containing hydrochloric acid (HCl) and organic cleaning agents. As illustrated in FIG. 2D, the cleaning and treatment procedure may also "thin" an upper portion of barrier layer 139, leading to a tapered thickness profile for barrier layer 139 on sidewall surfaces 132. The tapered thickness profile of barrier layer 139 causes its thickness to gradually increase from top to bottom. For example, although barrier layer 139 starts with a generally uniform thickness profile (FIG. 2C), after the cleaning and treatment procedure, barrier layer 139 may be significantly thinner on its upper portion than its lower portion (FIG. 2D). In some embodiments, the top surface of barrier layer 139 has a thickness that is less than the bottom thickness of barrier layer 139 (but still 50% or more (e.g., 60%, 70%) of the bottom thickness).

At operation 22, method 10 (FIG. 1) forms metal fill layer 141 over semiconductor device 100 (FIG. 2E). Metal fill layer 141 may include cobalt (Co), tungsten (W), platinum (Pt), silver (Ag), nickel (Ni), copper (Cu), palladium (Pd), combinations thereof, or other suitable material. Metal fill layer 141 may be formed by PVD, CVD, ALD, plating, or other suitable methods. In some embodiments, a combination of PVD and CVD processes is used when depositing metal fill layer 141. For example, a PVD process may be used first to deposit a thin cobalt layer as a seed layer (at slower deposition rate but with higher quality), and then a CVD process may be used to deposit a thick cobalt layer as a bulk layer (at faster deposition rate but perhaps not with same quality as cobalt seed layer). When depositing the seed layer, its thickness is controlled so that it does not block the deposition of the bulk layer in the bowing profile region. As shown in FIG. 2E, metal fill layer 141 is electrically coupled to S/D features 106a and 106b through barrier layer 139.

At operation 24, method 10 (FIG. 1) planarizes metal fill layer 141 using a chemical mechanical planarization (CMP) process, which removes a top portion of metal fill layer 141 (FIG. 2F). Each of contact plugs 136a and 136b includes barrier layer 139 and metal fill layer 141, as shown in FIG. 2F. A contact plug is sometimes also called a via, a via plug, a metal contact, or a metal plug. To facilitate the subsequent formation of air gaps, in some embodiments, the CMP process is sufficiently long to ensure exposure of silicon nitride features 142a-142d.

Figure 3C:
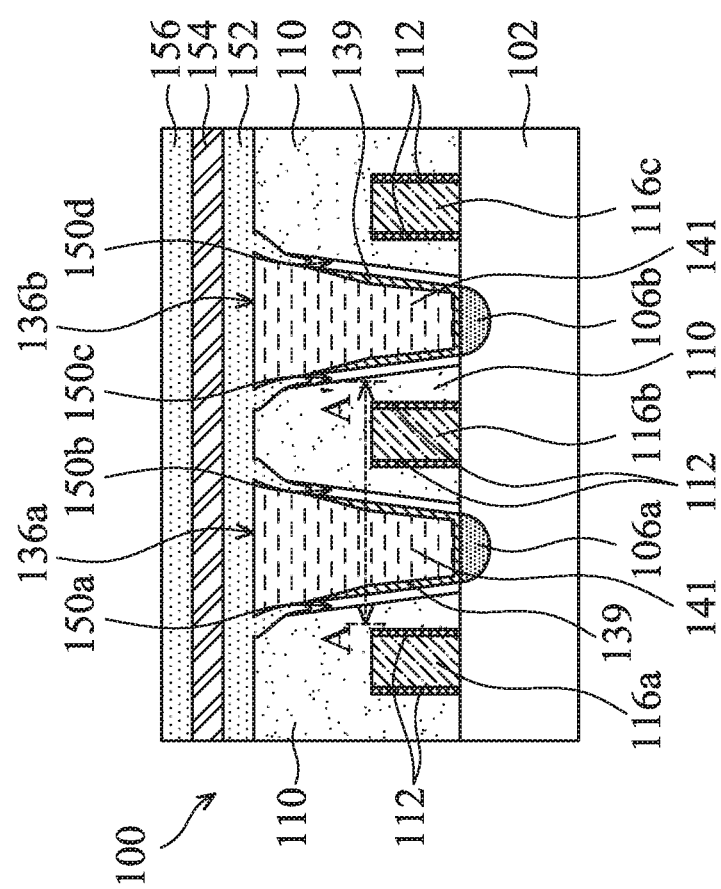

Following operation 24, air gaps can be formed using various approaches. FIGS. 3A-3C illustrate a first air gap formation approach, and FIGS. 5A-5E illustrate a second air gap formation approach. Both approaches are described below, in order.

At operation 26, method 10 (FIG. 1) removes silicon nitride features 142a-142d to form air gaps 150a-150d, respectively (FIG. 3A). Specifically, air gap 150a is formed between contact plug 136a and neighboring gate stack 116a to reduce a first capacitance therebetween, air gap 150b is formed between contact plug 136a and neighboring gate stack 116b to reduce a second capacitance therebetween, air gap 150c is formed between contact plug 136b and neighboring gate stack 116b to reduce a third capacitance therebetween, and air gap 150d is formed between contact plug 136b and neighboring gate stack 116c to reduce a fourth capacitance therebetween. Capacitances are reduced because air has a dielectric constant (k) of about one, which is lower than other dielectric materials. In some embodiments (e.g., when there is no overlay shift), air gaps 150a-150d have about the same dimensions, and the first, second, third, and fourth capacitances are about equal. But if there is overlay shift, air gaps 150a-150d may have different dimensions, thereby leading to different corresponding capacitances. Unequal capacitances on two sides of contact plug 136 (136a or 136b) may impact related circuitry unequally, but since both the first and second capacitances are reduced herein, their overall impact on circuitry is reduced.

It should be noted that method 10 disclosed herein forms air gaps 150a-150d after forming contact plugs 136a and 136b. This differs from conventional air gap formation approaches, which formed air gaps before forming their corresponding contact hole (and contact plug). Such a change in sequence is counter-intuitive, for example, because post-plug formation of air gaps brings unique etch selectivity considerations, and conventional approaches were unable to achieve such etch selectivity. But post-plug formation of air gaps, as disclosed herein, brings various benefits such as lowering the risk of short circuitry between gate stacks and neighboring S/D features when there is overlay shift. This in turn improves device reliability and enables higher breakdown voltage. Further, since the volume of air gaps is precisely controllable by adjusting heights and/or widths of silicon nitride features 142a-142d, the parasitic capacitance between gate stacks and contact plugs can be effectively controlled. Optimal AC/DC gain may be achieved without potential air gap damages. Further still, unlike conventional approaches where the top surfaces of air gaps were lower than gate stacks, air gaps 150a-150d disclosed herein extend above the top surfaces of gate stacks 116a-116c. The taller air gaps 150a-150d help reduce fringe capacitance, which constitutes part of the parasitic capacitance. For instance, air gap 150a reduces a fringe capacitance between the upper portion of contact plug 136a and the upper portion of gate stack 116a. As a result, the overall parasitic capacitance is further reduced between neighboring gate stacks and contact plugs.

In an embodiment, the material of silicon nitride features 142a-142d has high etch selectivity with respect to barrier layer 139, ILD layer 110, and metal fill layer 141 such that silicon nitride features 142a-142d can be fully removed without substantially impacting other surrounding layers. In an embodiment, silicon nitride features 142a-142d are removable in an etching process at least 10 times (or 20 times, or 50 times) faster than other materials in contact with silicon nitride features 142a-142d. Such etch selectivity depends on the choices of materials for silicon nitride features 142a-142d, barrier layer 139, ILD layer 110, and metal fill layer 141. Thus, the material makeup of these layers is considered in a combined fashion. In an embodiment, silicon nitride features 142a-142d include silicon nitride; barrier layer 139 includes Ti and TiN; ILD layer 110 includes a low-k material such as silicon oxide ($SiO_2$), silicon carbonitride (SiCN), and/or silicon oxycarbide (SiCO); and metal fill layer 141 includes Co and/or W. The etch selectivity is based on different reactivity to the same etchant.

The selective etching process at operation 26 may include dry etching, wet etching, reactive ion etching (RIE), and/or other suitable processes. In an embodiment, dry etching is used with a fluorine-containing gas including sulfur hexafluoride (SF6), carbon tetrafluoride (CF4), nitrogen trifluoride (NF3), selenium fluoride (SeF6), perfluoroethane (C2F6), perfluoropropane (C3F8), or another applicable gas, or combinations thereof. Fluorine radicals may be diluted (e.g., between 1-5%) to help etch selectivity. In some embodiments, the flow rate of the fluorine-containing gas is in a range from about 10 sccm to about 500 sccm. Dry etching effectively reaches silicon nitride sitting at the bottom of air gaps, which improves depth to width ratio of the air gaps. Alternatively, wet etching may be used with diluted hydrofluoric acid (DHF); potassium hydroxide (KOH) solution; ammonia; a solution containing hydrofluoric acid (HF), nitric acid (HNO$_3$), and/or acetic acid (CH$_3$COOH), or other suitable wet etchant.

At operation 28, method 10 (FIG. 1) seals air gaps 150a-150d by forming a capping layer or seal layer 152 (FIG. 3B) that covers air gaps 150a-150d. Upon formation of seal layer 152, the volumes of air gaps 150a-150d are finalized. As shown in FIG. 3B, seal layer 152 interfaces air gaps 150a-150d at a height that is above the top surfaces of gate stacks 116a-116c. The interface may be slightly lower than the top surface of ILD layer 110 because, during its formation, seal layer 152 penetrates slightly into air gaps 150a-150d (e.g., no greater than 5 nm, say 1-5 nm). In some embodiments, air gaps 150a-150d have very small width(s) (e.g., 1-5 nm) to reduce the risk of seal layer 152 penetrating deep into air gaps 150a-150d.

Seal layer 152 may be deposited using PVD, CVD, ALD, and/or other suitable methods. In an embodiment, PVD is used because it can quickly deposit an initial layer that blocks other materials from entering into air gaps 150a-150d. As a result, air gaps 150a-150d can be taller. In another embodiment, ALD with a carbon-containing precursor is used. In an embodiment, seal layer 152 has a thickness between 2-7 nm. Seal layer 152 may use any suitable material as long as it allows full enclosure of air gaps 150a-150d to prevent other materials from getting into air gaps 150a-150d. In an embodiment, seal layer 152 uses silicon, silicon oxide (SiO$_2$), silicon nitride (SiN), silicon carbonitride (SiCN), silicon carbide (SiC), or combinations thereof.

At operation 30, method 10 (FIG. 1) forms two additional layers—including a metal nitride layer 154 and an etch stop layer 156—over seal layer 152 (FIG. 3C). Seal layer 152 and etch stop layer 156 may both serve as middle contact etch stop layers (MCESLs), and in this case, metal nitride layer 154 is sandwiched between the two stop step layers to create an interleaving layers structure. In an embodiment, metal nitride layer 154 includes titanium nitride (TiN), and etch stop layer 156 includes silicon nitride (SiN) or another suitable material(s). Metal nitride layer 154 has relatively high resistivity compared to metal and may be used to form resistors in semiconductor device 100. Etch stop layer 156 facilitates further processes of method 10 that are not elaborated herein. For example, another contact plug may be formed over (and electrically connected) to contact plugs 136a and 136b. Metal wires may be formed to interconnect upper plugs as well as other circuit features.

Figure 4:
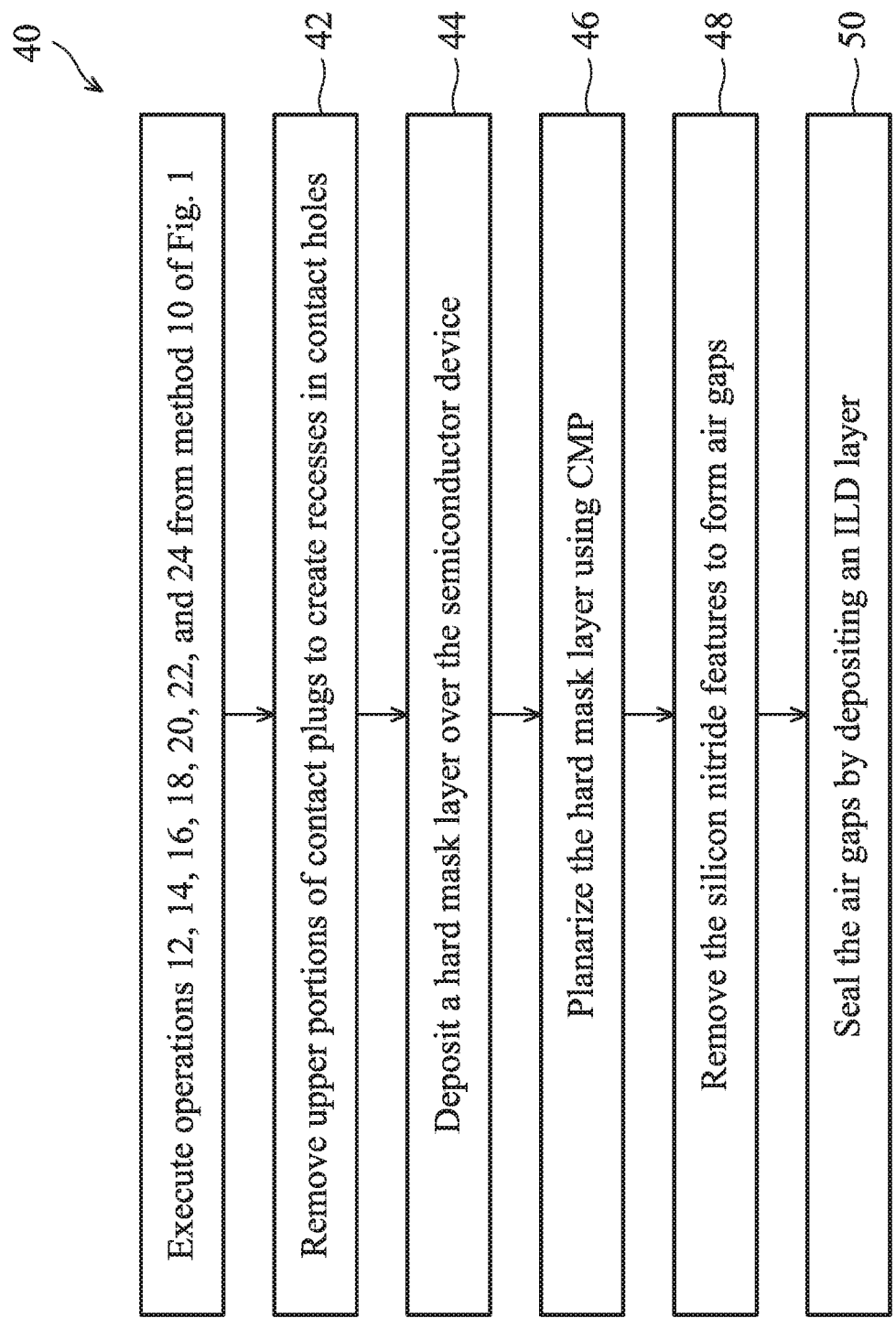
FIG. 4 is a flow chart showing a second method for fabricating a semiconductor device, according to various embodiments of the present disclosure.

As described above, FIGS. 3A-3C (corresponding to operations 26, 28, and 30 represent a first air gap formation approach. In comparison, FIGS. 5A-5E illustrate a second air gap formation approach, which corresponds to method 40 shown in FIG. 4. Since many aspects of method 10 and method 40 are the same, including operations 12-24, the same or similar aspects are not repeatedly described in the interest of conciseness. The description below focuses on aspects of method 40 that differs from method 10.

Figures 5A, 5B:
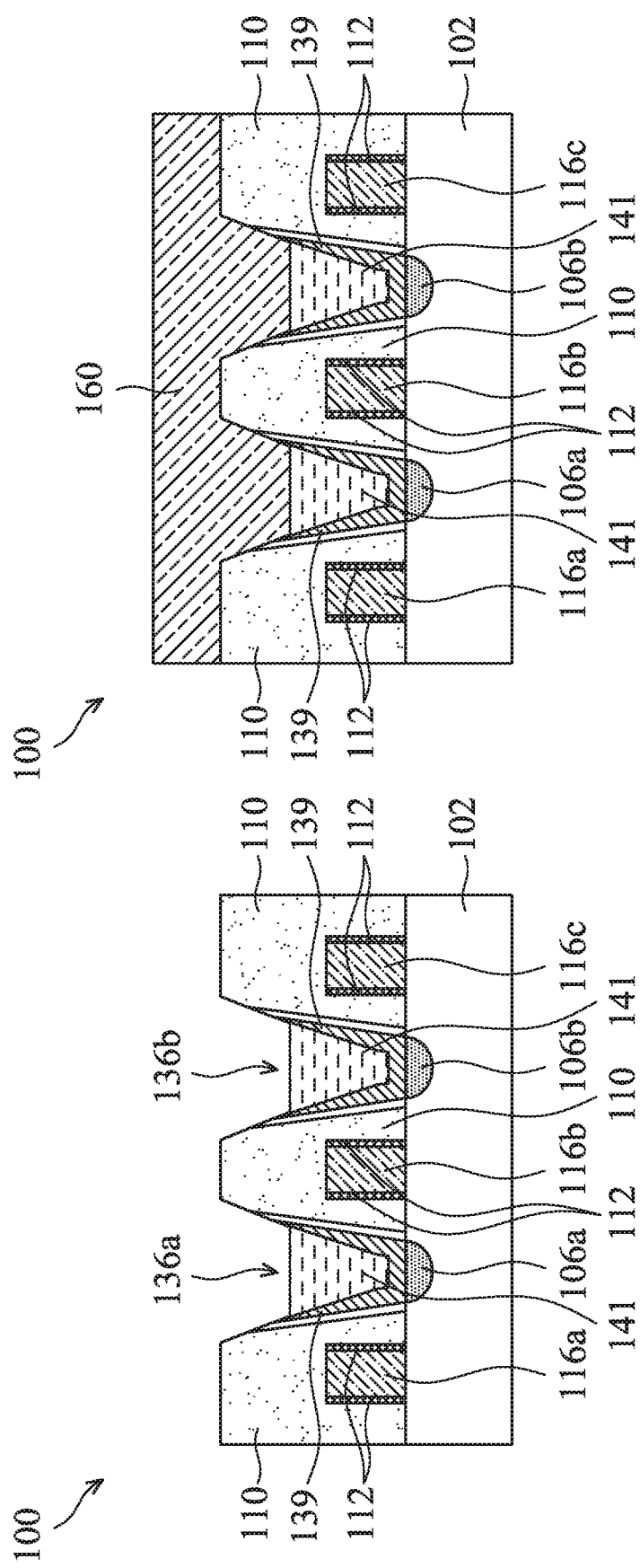
FIGS. 5A, 5B, 5C, 5D, and 5E are schematic diagrams illustrating cross-sectional views of a semiconductor device during various stages of the method shown in FIG. 4.

Method 40 begins with semiconductor device 100 that has gone through operation 24 as described above. Then, at operation 42, method 40 (FIG. 4) removes upper portions of contact plugs 136a and 136b to create two recesses in contact holes 130a and 130b, respectively (FIG. 5A). Specifically, the remaining portions of metal fill layer 141, as shown in FIG. 2F, are "etched back" to create the recesses.

A small upper portion of barrier layer 139, as shown in FIG. 2F, may also be removed. The recesses are formed by a selective etching process, which may use dry etching, wet etching, RIE, and/or other suitable processes. Etching conditions are tailored to keep a target thickness of contact plugs 136a and 136b in order to facilitate the subsequent operation 44. In an embodiment, the recesses are at least 3 nm above top surfaces of gate stacks 116a-116c.

At operation 44, method 40 (FIG. 4) deposits a hard mask layer 160 over the top surface of semiconductor device 100 (FIG. 5B). Hard mask layer 160 may include any suitable material. In an embodiment, hard mask layer 160 includes silicon, silicon carbonitride (SiCN), hafnium oxide (HfO$_2$), alumina (Al$_2$O$_3$), zirconium oxide (ZrO$_2$), or combinations thereof, or another isolation material. Hard mask layer 160 may be formed by PVD, CVD, ALD, plating, or other suitable methods.

At operation 46, method 40 (FIG. 4) planarizes hard mask layer 160 using a CMP process (FIG. 5C), which removes a top portion of hard mask layer 160. To facilitate the subsequent formation of air gaps, in some embodiments, the CMP process is sufficiently long to ensure exposure of silicon nitride features 142a-142d. For example, the CMP process may also remove a top portion of ILD layer 110 to expose top surfaces of silicon nitride features 142a-142d. In an embodiment, between 2-5 nm of hard mask layer 160 remains after CMP. Collectively, operations 44 and 46 form hard mask layer 160 that fills both recesses created by operation 42 in contact holes 130a and 130b. Hard mask layer 160 leaves top surfaces of silicon nitride features 142a-142d exposed.

Figures 5C, 5D:
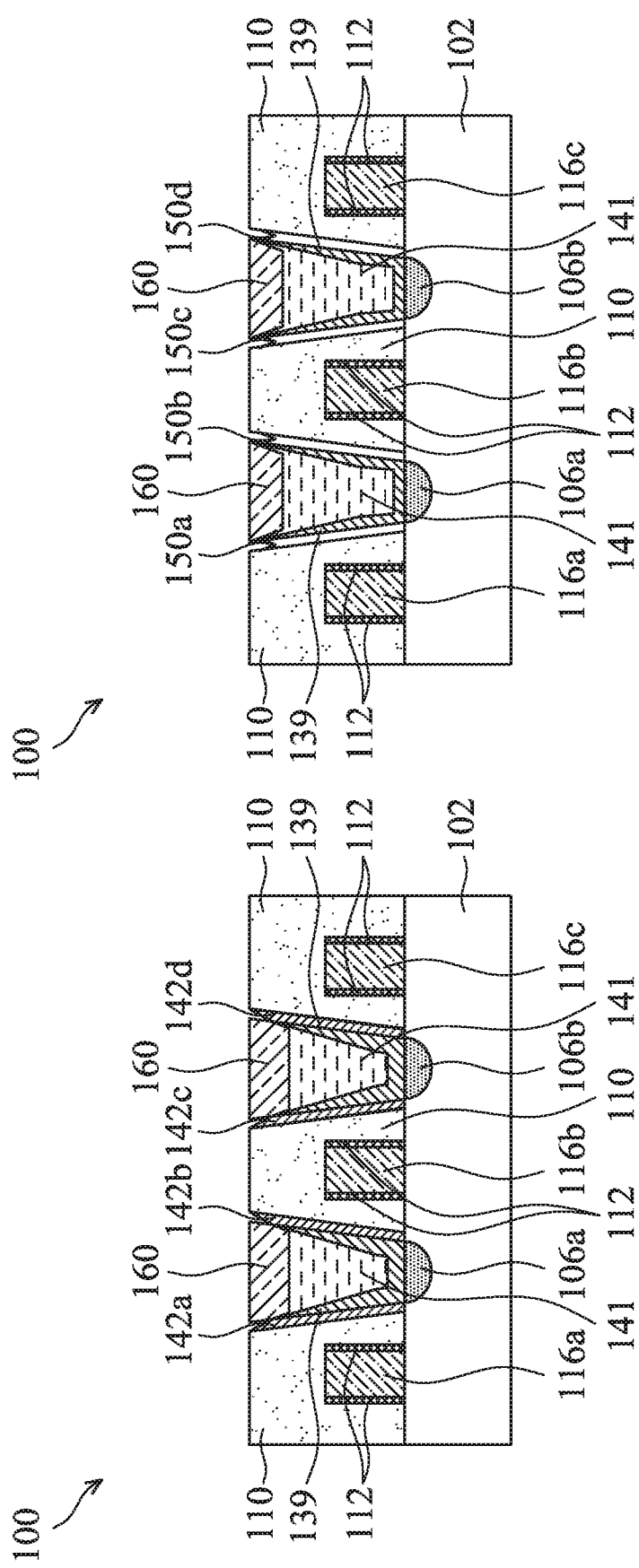

At operation 48, method 40 (FIG. 4) removes silicon nitride features 142a-142d to form air gaps 150a-150d, respectively (FIG. 5D). Characteristics of air gaps 150a-150d as described above with respect to method 10 would similarly apply here. However, in method 40 the height of air gaps 150a-150d may be relatively smaller if a top portion of ILD layer 110 is removed in the CMP process of operation 46. Further, the selective etching process at operation 48 has high etch selectivity of silicon nitride features 142a-142d compared to barrier layer 139, ILD layer 110, and hard mask layer 160 such that silicon nitride features 142a-142d can be fully removed without substantially impacting other surrounding layers. Such etch selectivity now additionally depends on the choice of material for hard mask layer 160.

Figure 5E:
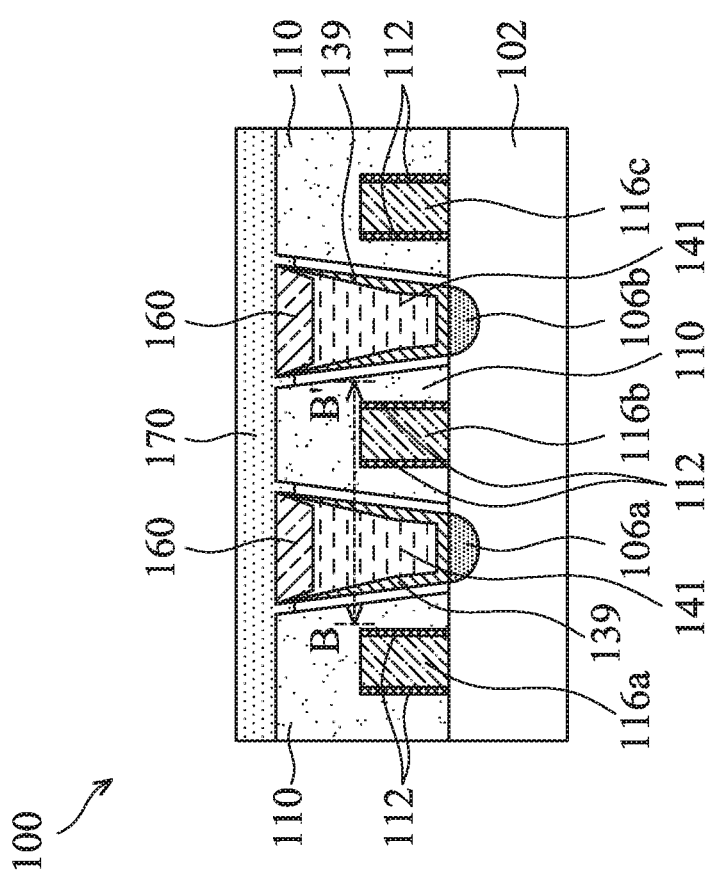

At operation 50, method 40 (FIG. 4) seals air gaps 150a-150d by depositing a second ILD layer 170 (FIG. 5E) that covers air gaps 150a-150d. ILD layer 170 is also a seal or capping layer. Upon formation of ILD layer 170, the volumes of air gaps 150a-150d are finalized. As shown in FIG. 5E, ILD layer 170 interfaces air gaps 150a-150d at a height that is above the top surfaces of gate stacks 116a-116c. The interface may be slightly lower than the top surface of ILD layer 110 because, during its formation, ILD layer 170 penetrates slightly into air gaps 150a-150d (e.g., for 1-5 nm). But the interface is still higher than the bottom surfaces of hard mask layer 160 (which correspond to top surfaces of contact plugs 136a and 136b, as shown in FIG. 5E). In some embodiments, air gaps 150a-150d have very small width(s) (e.g., 1-5 nm or even smaller such as 0.5 nm) to reduce the risk of ILD layer 170 penetrating deep into air gaps 150a-150d.

ILD layer 170 may be deposited using PVD, CVD, ALD, and/or other suitable methods. In an embodiment, PVD is used because it can quickly deposit an initial layer that blocks other materials from entering into air gaps 150a-150d. As a result, air gaps 150a-150d can be taller. In another embodiment, ALD with a carbon-containing precursor is used. ILD layer 170 may use any suitable material as long as it allows full enclosure of air gaps 150a-150d to prevent other materials from getting into air gaps 150a-150d. In an embodiment, ILD layer 170 includes silicon oxide ($SiO_2$).

Figure 6:
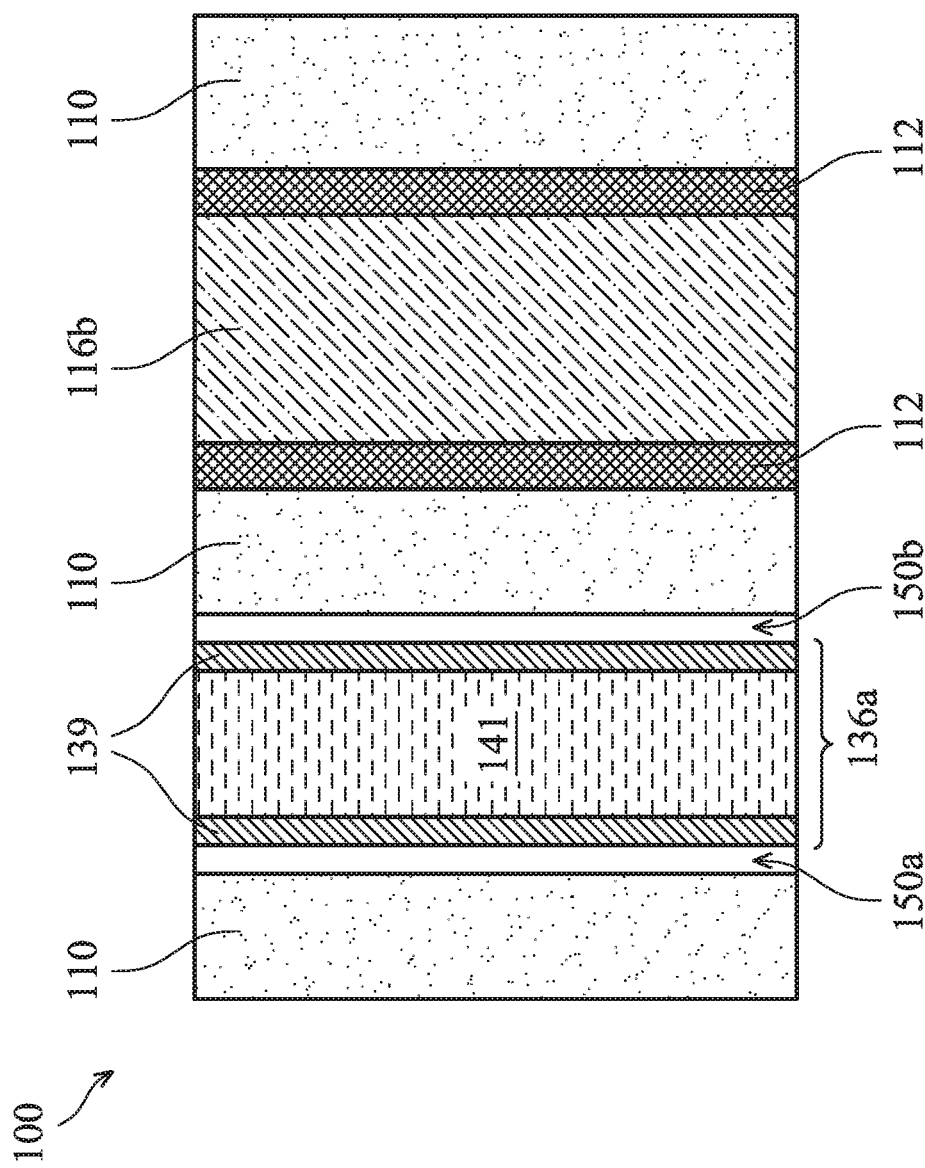
FIG. 6 is a schematic diagram illustrating a partial plan view of a semiconductor device, according to various embodiments of the present disclosure.

Note that, although method 10 and method 40 lead to different structures on semiconductor device 100, many aspects of those structures may be similar or identical. For instance, the plan view of part of semiconductor device 100 at a height below gate stacks 116a-116c would be the same. FIG. 6 illustrates a partial plan view of semiconductor device 100 at a height marked by line A-A' in FIG. 3C and by line B-B' in FIG. 5E. FIG. 6 represents the same partial view for both FIG. 3C and FIG. 5E. Notably, air gap 150b—which is disposed between contact plug 136a and gate stack 116b—is near and aligned with contact plug 136a. Indeed, air gap 150b directly exposes the sidewall of contact plug 136a to air within air gap 150b. Such air exposure helps heat dissipation when contact plug 136a is conducting an electric current, since air has higher thermal conductivity than other materials next to contact plug 136a. Note that the air within air gap 150b may be atmospheric air or other suitable gas(es) (e.g., an inert gas) filled into air gap 150b to facilitate thermal conduction. On the other hand, air gap 150b is relatively far away from gate stack 116b, as it is separated from gate stack 116b by ILD layer 110 (and by spacer 112 when spacer 112 is not considered part of gate stack 116b).

In both method 10 and method 40, each component may be formed with suitable dimensions (e.g., thickness, height, depth, or width). For example, in an embodiment, as shown in FIG. 6, contact plug 136a has a width between 20-50 nm; barrier layer 139 on either side of contact plug 136a has a width between 1-2 nm; each of air gaps 150a and 150b has a width between 1-5 nm.

Although not intended to be limiting, one or more embodiments of the present disclosure provide many benefits to a semiconductor device and the formation thereof. Specifically, the timing change in the formation of air gaps leads to structural and positional changes of various components. For example, the air gap formation techniques disclosed herein realizes air gaps that extend above the top surfaces of neighboring gate stacks. Therefore, parasitic capacitance between a gate stack and a contact plug can be effectively reduced. In addition, air gaps are aligned with contact plugs instead of gate stacks. Air gaps directly expose sidewalls of contact plugs to air, which helps heat dissipation when contact plugs conduct electric currents. Embodiments of the disclosed methods can be readily integrated into existing manufacturing processes and technologies, such as middle end of line (MEoL) and back end of line (BEoL) processes.

In one exemplary aspect, the present disclosure provides a method for semiconductor manufacturing comprising forming first and second silicon nitride features on sidewall surfaces of a contact hole, where the contact hole is disposed in a dielectric layer and above a source/drain (S/D) feature. The method further comprises forming a contact plug in the contact hole, the contact plug being electrically coupled to the S/D feature, removing a top portion of the contact plug to create a recess in the contact hole, forming a hard mask layer in the recess, and removing the first and second silicon nitride features via selective etching to form first and second air gaps, respectively. In an embodiment, the first air gap is formed between the contact plug and the dielectric layer to reduce a first capacitance between the contact plug and a first neighboring gate stack. The second air gap is formed between the contact plug and the dielectric layer to reduce a second capacitance between the contact plug and a second neighboring gate stack. In an embodiment, the first and second air gaps are formed such that the contact plug is directly exposed to the first and second air gaps. In an embodiment, the dielectric layer is a first ILD layer, and the method further comprises forming over the contact plug a second ILD layer that covers the first and second air gaps. In an embodiment, the second ILD layer interfaces the first and second air gaps at a height that is above top surfaces of the first and second neighboring gate stacks. In an embodiment, the first and second air gaps are separated from the first and second neighboring gate stacks, respectively, by at least the first ILD layer which includes a low-k material. In an embodiment, forming the hard mask layer in the recess comprises depositing the hard mask layer, and removing a top portion of the hard mask layer using a CMP process. The CMP process exposes top surfaces of the first and second silicon nitride features to facilitate the removal of the first and second silicon nitride features. In an embodiment, a remaining thickness of the hard mask layer in the recess after the CMP process is 2-5 nm, and the recess is at least 3 nm above a neighboring gate stack of the contact plug. In an embodiment, the contact plug comprises a barrier layer and a metal fill layer. Here, forming the contact plug comprises forming the barrier layer between the first and second silicon nitride features, depositing the metal fill layer covering the barrier layer and the dielectric layer, and removing a top portion of the metal fill layer using a CMP process. In an embodiment, the first and second silicon nitride features have etch selectivity such that the first and second silicon nitride features are removable at a rate at least 10 times faster than other materials in contact with the first and second silicon nitride features.

In another exemplary aspect, the present disclosure provides a method comprising providing a semiconductor device structure, which including a substrate, first and second gate stacks on the substrate, first and second silicon nitride features between the first and second gate stacks, and a contact plug between, and in direct contact with, the first and second silicon nitride features. The method further comprises etching the first and second silicon nitride features to form first and second air gaps, respectively, where the first and second air gaps expose sidewalls of the contact plug to air within the first and second air gaps. The method further comprises forming a seal layer over the contact plug to cover the first and second air gaps. In an embodiment, the seal layer interfaces the first and second air gaps at a height that is above top surfaces of the first and second gate stacks. In an embodiment, the seal layer is formed using a PVD process such that the seal layer interfaces the first and second air gaps at a height that is no greater than 5 nm below a top surface of the contact plug. In an embodiment, the first and second air gaps both have a width between 1-5 nm. The first and second air gaps are separated from the first and second gate stacks, respectively, by at least an ILD layer that includes a low-k material.

In yet another exemplary aspect, the present disclosure provides a semiconductor device comprising a substrate, a source/drain (S/D) feature disposed on the substrate, a metal plug disposed over the S/D feature, a gate stack disposed adjacent the metal plug, an air gap disposed between the metal plug and the gate stack, and a capping layer that covers the air gap. The air gap at least partially exposes a sidewall of the metal plug to air within the air gap. In an embodiment, an interface between the capping layer and the air gap is higher than a top surface of the gate stack. In an embodiment, the metal plug comprises a barrier layer that includes a tapered thickness profile. In an embodiment, the metal plug further comprises a metal fill layer disposed above and adjacent the barrier layer, wherein the barrier layer comprises titanium nitride (TiN), and wherein the metal fill layer comprises tungsten (W) or cobalt (Co). In an embodiment, the semiconductor device further comprises an ILD layer in direct contact with the air gap, wherein the ILD layer comprises silicon oxide ($SiO_2$), silicon carbonitride (SiCN), silicon oxycarbide (SiCO), or combinations thereof. In an embodiment, the semiconductor device further comprises a hard mask layer disposed between the metal plug and under the capping layer, wherein a bottom surface of the hard mask layer is higher than a top surface of the gate stack.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor manufacturing, comprising:
    forming first and second silicon nitride features on sidewall surfaces of a contact hole, the contact hole being disposed in a dielectric layer and above a source/drain (S/D) feature;
    forming a contact plug in the contact hole, the contact plug being electrically coupled to the S/D feature;
    removing a top portion of the contact plug to create a recess in the contact hole;
    forming a hard mask layer in the recess; and
    removing the first and second silicon nitride features via selective etching to form first and second air gaps, respectively.

2. The method of claim 1, wherein the first air gap is formed between the contact plug and the dielectric layer to reduce a first capacitance between the contact plug and a first neighboring gate stack, and wherein the second air gap is formed between the contact plug and the dielectric layer to reduce a second capacitance between the contact plug and a second neighboring gate stack.

3. The method of claim 2, wherein the first and second air gaps are formed such that the contact plug is directly exposed to the first and second air gaps.

4. The method of claim 2, wherein the dielectric layer is a first inter-layer dielectric (ILD) layer, and wherein the method further comprises forming over the contact plug a second ILD layer that covers the first and second air gaps.

5. The method of claim 4, wherein the second ILD layer interfaces the first and second air gaps at a height that is above top surfaces of the first and second neighboring gate stacks.

6. The method of claim 5, wherein the first and second air gaps are separated from the first and second neighboring gate stacks, respectively, by at least the first ILD layer which includes a low-k material.

7. The method of claim 1, wherein forming the hard mask layer in the recess comprises:
    depositing the hard mask layer; and
    removing a top portion of the hard mask layer using a chemical mechanical planarization (CMP) process, wherein the CMP process exposes top surfaces of the first and second silicon nitride features to facilitate the removal of the first and second silicon nitride features.

8. The method of claim 7, wherein a remaining thickness of the hard mask layer in the recess after the CMP process is 2-5 nm, and wherein the recess is at least 3 nm above a neighboring gate stack of the contact plug.

9. The method of claim 1, wherein the contact plug comprises a barrier layer and a metal fill layer, and wherein forming the contact plug comprises:
    forming the barrier layer between the first and second silicon nitride features;
    depositing the metal fill layer covering the barrier layer and the dielectric layer; and
    removing a top portion of the metal fill layer using a chemical mechanical planarization (CMP) process.

10. The method of claim 1, wherein the first and second silicon nitride features have etch selectivity such that the first and second silicon nitride features are removable at a rate at least 10 times faster than other materials in contact with the first and second silicon nitride features.

11. A method, comprising:
    providing a semiconductor device structure including:
        a substrate;
        first and second gate stacks on the substrate;
        first and second silicon nitride features disposed on sidewall surfaces of a contact hole defined in and surrounded by a dielectric layer between the first and second gate stacks;
        a barrier layer formed of a material different than silicon nitride and disposed on lower portions of the first and second silicon nitride features; and
        a metal fill layer including a top portion and a bottom portion, wherein the top portion is in direct contact with the first and second nitride features and the bottom portion is in direct contact with the barrier layer;
    etching the first and second silicon nitride features, without substantially etching the barrier layer, to form first and second air gaps, respectively, wherein the first and second air gaps expose sidewalls of the metal fill layer to air within the first and second air gaps; and
    forming a seal layer over the metal fill layer to cover the first and second air gaps.

12. The method of claim 11, wherein the seal layer interfaces the first and second air gaps at a height that is above top surfaces of the first and second gate stacks.

13. The method of claim 12, wherein the seal layer is formed using a physical vapor deposition (PVD) process such that the seal layer interfaces the first and second air gaps at a height that is no greater than 5 nm below a top surface of the metal fill layer.

14. The method of claim 11, wherein the first and second air gaps both have a width between 1-5 nm, and wherein the first and second air gaps are separated from the first and second gate stacks, respectively, by at least an interlayer dielectric (ILD) layer that includes a low-k material.

15. The method of claim 11, wherein the metal fill layer is separated from the first gate stack by the first air gap.

16. A method, comprising:
    forming first and second silicon nitride features on sidewall surfaces of a contact hole, the contact hole being disposed in a dielectric layer and above a source/drain (S/D) feature;

forming a contact plug in the contact hole, the contact plug being electrically coupled to the S/D feature and comprising:
- a barrier layer, and
- a metal fill layer over the barrier layer such that a top portion of the metal fill layer is in direct contact with the first and second silicon nitride features and a bottom portion of the metal fill layer is spaced apart from the first and second silicon nitride features by the barrier layer; and removing the first and second silicon nitride features via selective etching to form first and second air gaps, respectively.

17. The method of claim 16, wherein the forming of the contact plug comprises:
depositing the barrier layer over the contact hole;
etching the barrier layer to expose top portions of sidewalls of the first and second silicon nitride features; and
after the etching of the barrier layer, depositing the metal fill layer over the barrier layer.

18. The method of claim 17, further comprising:
cleaning the etched barrier layer to form a tapered thickness profile of the barrier layer,
wherein the tapered thickness profile comprises a first thickness of an upper portion of the barrier layer and a second thickness of a bottom portion of the barrier layer,
wherein the second thickness is greater than the first thickness.

19. The method of claim 17, wherein the forming of the barrier layer comprises:
depositing a metal layer in contact with the S/D feature, the first silicon nitride feature, and the second silicon nitride feature; and
annealing the metal layer to form a metal silicide in contact with the S/D feature and the barrier layer in contact with the first and second nitride features.

20. The method of claim 19, wherein the metal layer comprises titanium or tantalum and the barrier layer comprises titanium nitride or tantalum nitride.

* * * * *